United States Patent
Yu

(10) Patent No.: US 7,411,228 B2
(45) Date of Patent: Aug. 12, 2008

(54) INTEGRATED CIRCUIT CHIP AND MANUFACTURING PROCESS THEREOF

(75) Inventor: Yu-Lung Yu, Taipei (TW)

(73) Assignee: Via Technologies, Inc., Taipei (TW)

( * ) Notice: Subject to any disclaimer, the term of this patent is extended or adjusted under 35 U.S.C. 154(b) by 124 days.

(21) Appl. No.: 11/386,838

(22) Filed: Mar. 23, 2006

(65) Prior Publication Data

US 2007/0052102 A1 Mar. 8, 2007

(30) Foreign Application Priority Data

Sep. 6, 2005 (TW) .............................. 94130610 A

(51) Int. Cl.
*H01L 23/12* (2006.01)

(52) U.S. Cl. ...................... 257/211; 257/700; 438/106; 438/128

(58) Field of Classification Search ................ 257/211, 257/700; 438/106, 128
See application file for complete search history.

(56) References Cited

U.S. PATENT DOCUMENTS

| 2002/0125577 | A1 | 9/2002 | Komada |
| 2005/0098893 | A1* | 5/2005 | Tsutsue et al. .............. 257/758 |
| 2005/0151239 | A1 | 7/2005 | Lee |
| 2005/0179213 | A1 | 8/2005 | Huang et al. |

* cited by examiner

*Primary Examiner*—Douglas M Menz
(74) *Attorney, Agent, or Firm*—Birch, Stewart, Kolasch & Birch, LLP

(57) ABSTRACT

An integrated circuit chip includes a substrate, a device layer, an interconnection layer, a sealing base layer and a sealing ring stack layer. The substrate has a sealing region and a chip region. The sealing region is disposed around the chip region. The device layer is disposed within the chip region. The interconnection layer is disposed over and connected with the device layer. The sealing base layer is disposed within the sealing region. The sealing ring stack layer is disposed over and connected with the sealing base layer. A manufacturing process of the integrated circuit chip is also disclosed.

20 Claims, 9 Drawing Sheets

INTEGRATED CIRCUIT CHIP AND MANUFACTURING PROCESS THEREOF

BACKGROUND OF THE INVENTION

1. Field of Invention

The present invention relates to an integrated circuit chip and a manufacturing process of the integrated circuit chip, and more particularly to an integrated circuit chip and a manufacturing process of the integrated circuit chip capable of preventing an internal structure of the integrated circuit chip from being damaged by a crack generated by a stress.

2. Related Art

A semiconductor wafer is formed into a plurality of integrated circuit chips after the semiconductor manufacturing processes are performed. Each integrated circuit chip includes a device region and a peripheral circuit region. The finished semiconductor wafer has to be sliced into bare chips, which are then packaged and tested to form the integrated circuit chips.

In the process of slicing the wafer, the generated slicing stress tends to cause a crack, which may damage the internal circuit of the integrated circuit chip. Thus, a sealing ring structure is formed between the integrated circuit chip and a scribing line in order to protect the structure of the integrated circuit chip.

Referring to FIGS. 1a and 1b, a conventional integrated circuit chip 1 includes a substrate 11, a device stack layer 12 and a sealing ring stack layer 13. The substrate 11 has a sealing region 111 and a chip region 112. The sealing region 111 is disposed around the chip region 112. The device stack layer 12 is disposed within the chip region 112 of the substrate 11 and has internal traces (not shown). The sealing ring stack layer 13 is disposed within the sealing region 111 of the substrate 11 and has a sealing base layer 131 and a plurality of sealing layers 132. The sealing base layer 131 is an electrically conductive region, which provides a ground for the sealing ring stack layer 13 and is formed by a boron-doped silicon or a phosphorus-doped silicon. Each sealing layer 132 is an electrically conductive layer made of aluminum, silver, copper or their alloy.

As shown in FIG. 2, the flip chip packaging technology is generally adopted with the progress of the technology of packaging. An active surface 14 of the integrated circuit chip 1 is directly electrically connected with a carrier 2. During the packaging process, the sealing base layer 131 cannot isolate a crack 15 generated by an external force from entering the integrated circuit chip 1 because a gap exists between the bottom surface of the substrate 11 and the sealing ring stack layer 13. Thus, the internal traces in the device stack layer 12 tend to be damaged. The crack 15 may not damage the internal traces during the packaging process. However, when the tests including a temperature cycle test and a thermal shock test are performed after the chip is packaged, the crack 15 may further enter the integrated circuit chip 1 due to thermal expansion and contraction, thereby damaging the internal traces of the integrated circuit chip 1. In addition, the integrated circuit chip 1 tends to be damaged by the external force in a transporting process or other manufacturing processes.

It is therefore an important subject of the present invention to provide an integrated circuit chip and a manufacturing process of the integrated circuit chip to prevent an internal structure of the integrated circuit chip from being damaged by a crack generated by a stress.

SUMMARY OF THE INVENTION

In view of the foregoing, the present invention is to provide an integrated circuit chip and a manufacturing process of the integrated circuit chip to prevent an internal structure of the integrated circuit chip from being damaged by a crack generated by a stress, and to enhance the production quality and the manufacturing efficiency.

According to one embodiment of the present invention, an integrated circuit chip according to the present invention includes a substrate, a device layer, an interconnection layer, a sealing base layer and a sealing ring stack layer. The substrate has a chip region and a sealing region disposed around the chip region. The device layer is disposed within the chip region. The interconnection layer is disposed over and connected with the device layer. The sealing base layer is disposed within the sealing region. The sealing ring stack layer is disposed over and connected with the sealing base layer.

According to one embodiment of the present invention, a manufacturing process of an integrated circuit chip according to the present invention includes the steps of: providing a substrate having a chip region and a sealing region disposed around the chip region; forming a device layer within the chip region; forming a sealing base layer within the sealing region; forming an interconnection layer over the device layer and connecting the interconnection layer with the device layer; forming a sealing ring stack layer over the sealing base layer and connecting the sealing ring stack layer with the sealing base layer; and forming a protecting layer on the interconnection layer and the sealing ring stack layer.

As mentioned above, the sealing base layer prevents the crack generated by the stress from entering an internal structure of the integrated circuit chip through the gap between the bottom surface of the substrate and the sealing ring stack layer and thus provides the complete protection to the integrated circuit chip. Compared with the prior art, the internal traces of an integrated circuit chip and a manufacturing process of the integrated circuit chip according to the present invention will not be damaged by the stress during the process of wafer slicing, packaging, testing or transporting or other manufacturing processes. Thus, the production quality and the manufacturing efficiency of the integrated circuit chip can be enhanced effectively.

BRIEF DESCRIPTION OF THE DRAWINGS

The present invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
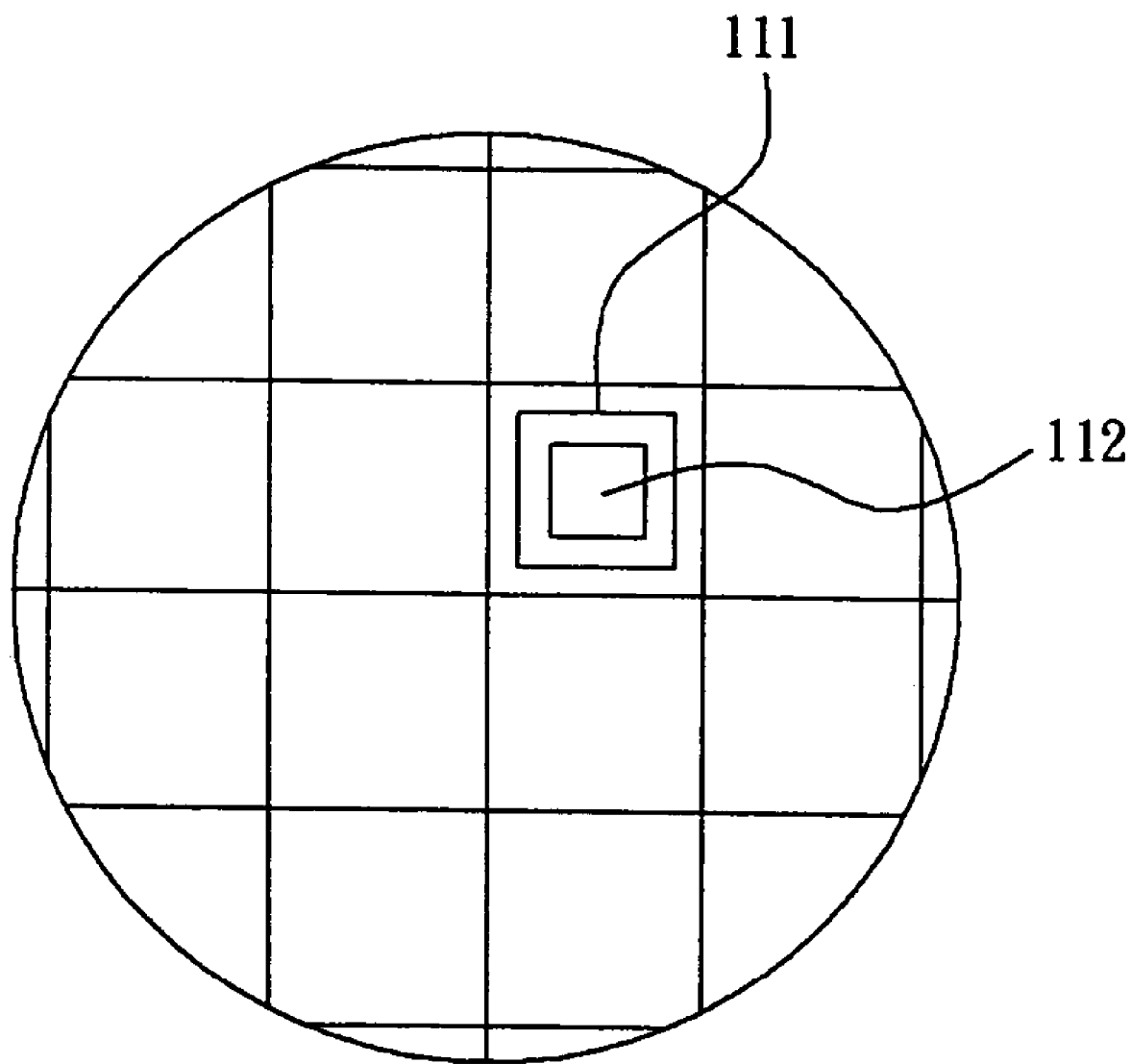
FIG. 1a is a top view showing a conventional integrated circuit chip.
Figure 1B:
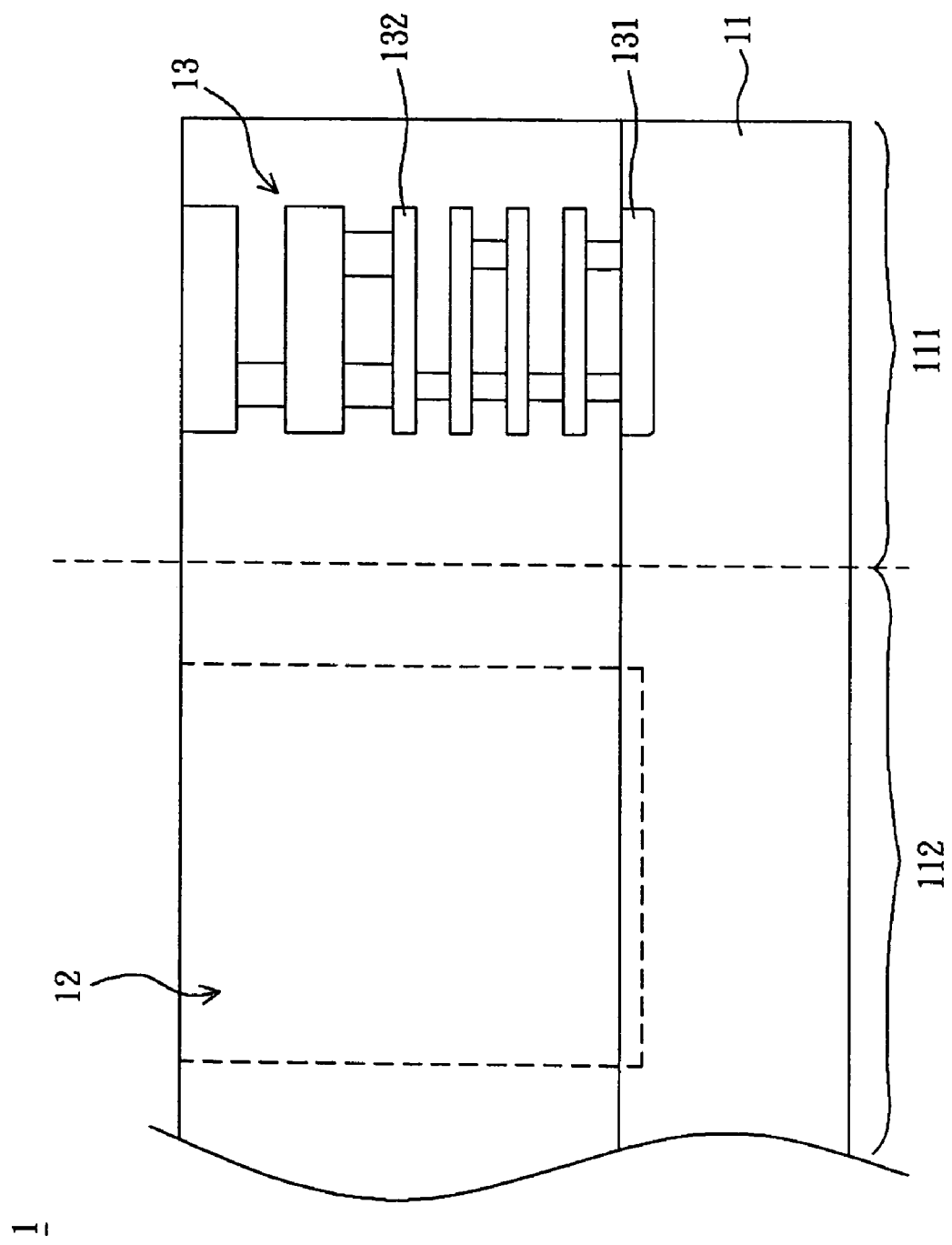
FIG. 1b is a schematic view showing the conventional integrated circuit chip.
Figure 2:
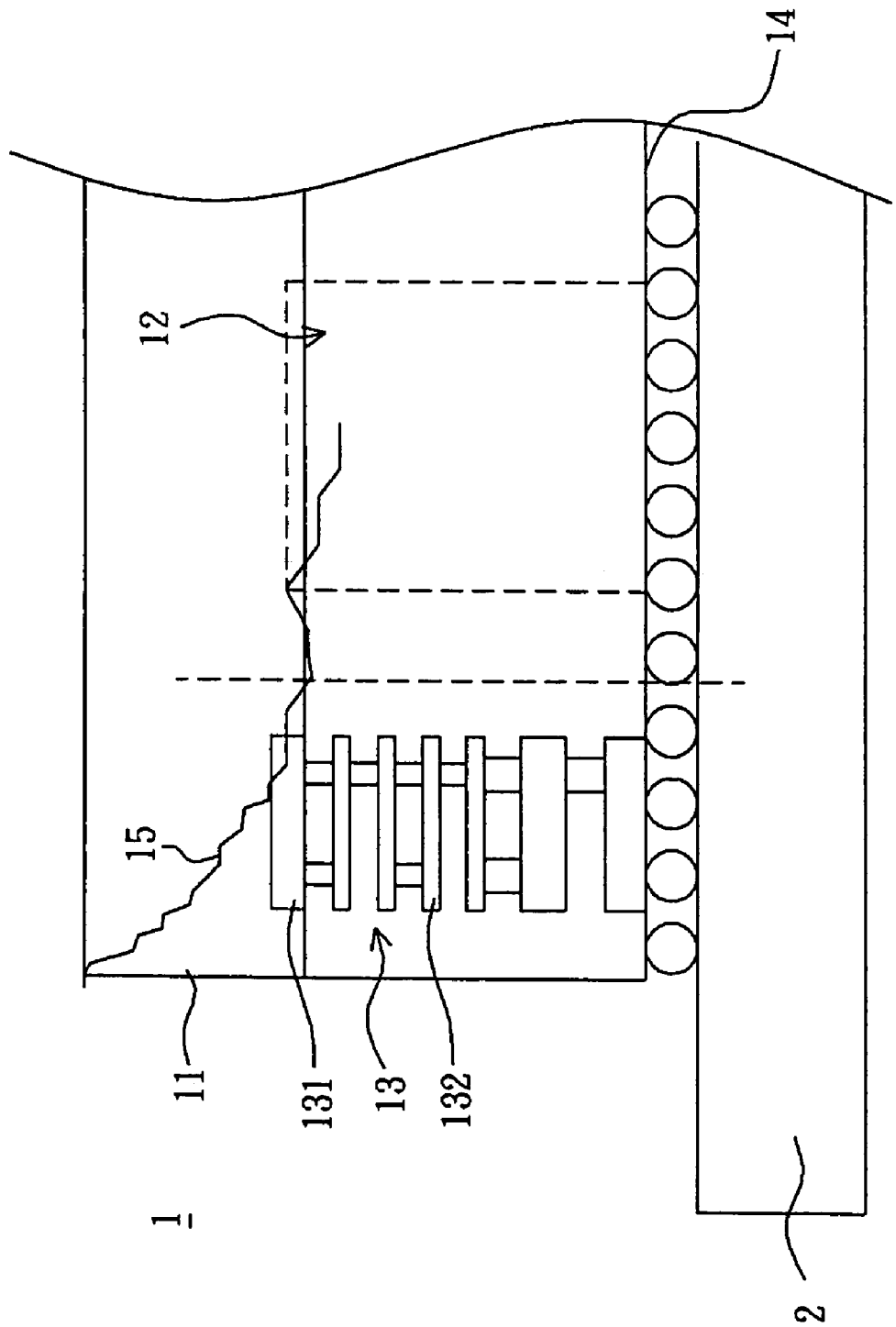
FIG. 2 is a schematic view showing the packaging of the conventional integrated circuit chip.
Figure 3:
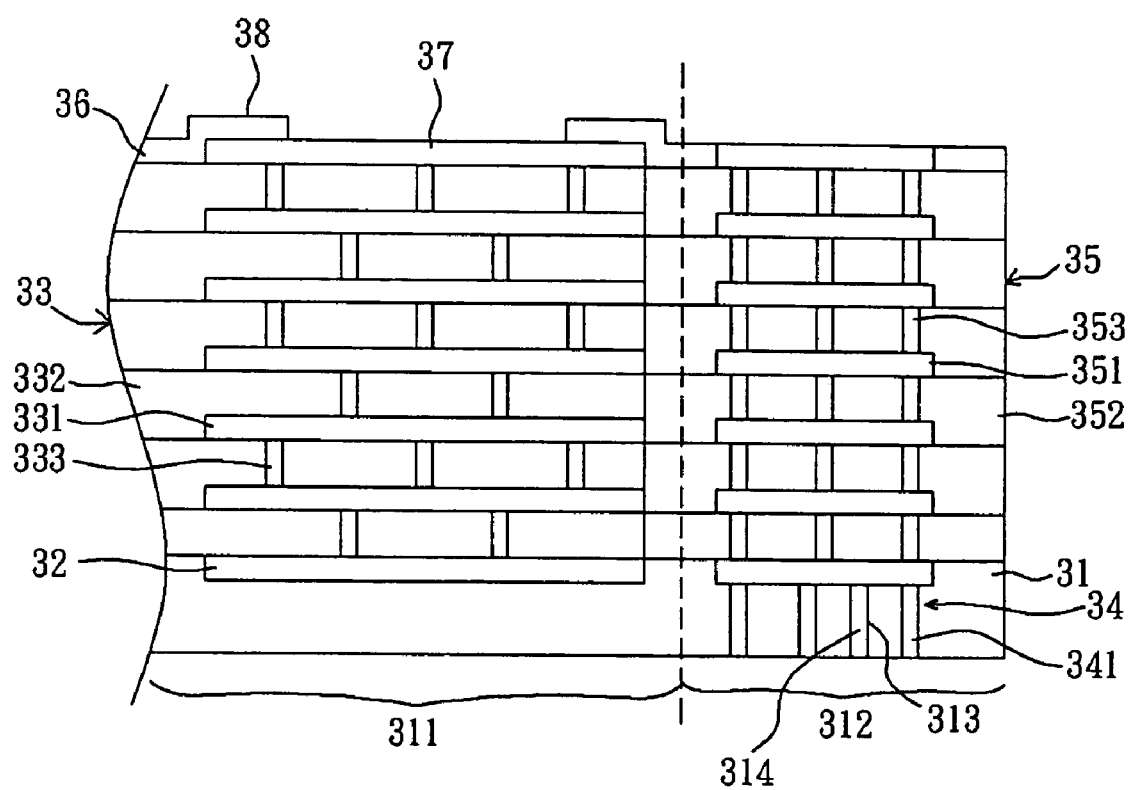
FIG. 3 is a schematic view showing an integrated circuit chip according to the present invention.

Referring to FIG. 3, an integrated circuit chip 3 according to the present invention includes a substrate 31, a device layer 32, an interconnection layer 33, a sealing base layer 34 and a sealing ring stack layer 35.

In this embodiment, the substrate 31 is a silicon substrate, and may also be a substrate made of, for example, germanium. The substrate 31 has a chip region 311 and a sealing region 312 disposed around the chip region 311.

The device layer 32 is disposed within the chip region 311 of the substrate 31 and has a plurality of transistors, each having the electrodes of source, drain and gate.

The interconnection layer 33 is disposed over and connected with the device layer 32. The interconnection layer 33 includes a plurality of metal layers 331, a plurality of dielectric layers 332 and a plurality of interconnections 333. The interconnections 333 may be wires, conductive vias, or contacts. The metal layers 331 are disposed over the device layer 32. The dielectric layers 332 are respectively disposed between the metal layers 331. The interconnections 333 are respectively disposed within the dielectric layer 332 to electrically connect with the metal layers 331. The internal traces of the integrated circuit chip 3 are formed according to the layouts of the interconnections 333 and the metal layers 331. However, they are not important points of the present invention, and detailed descriptions thereof will be omitted.

Figure 4:
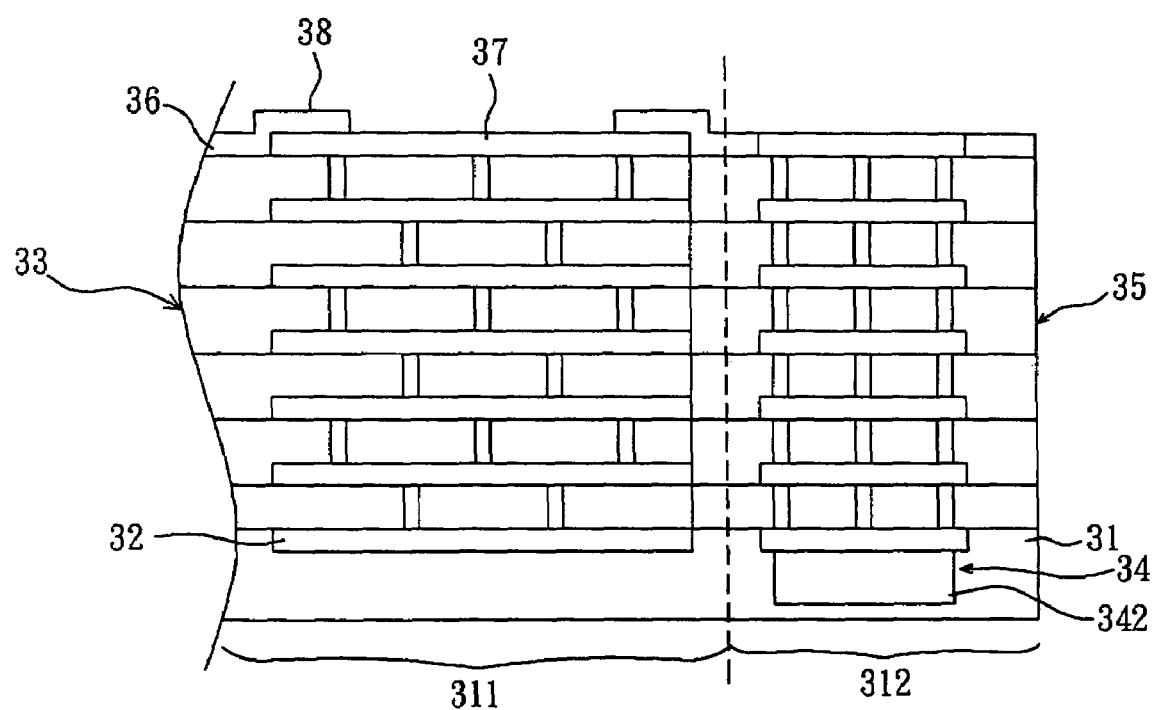
FIG. 4 is another schematic view showing the integrated circuit chip according to the present invention.
Figure 5:
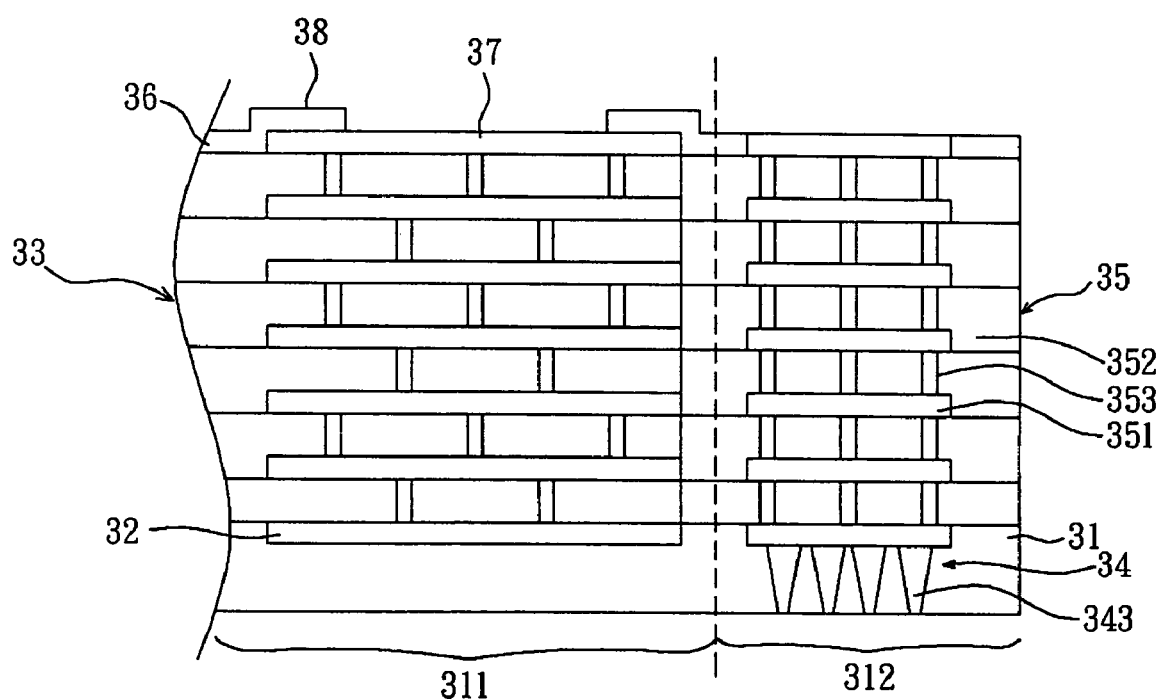
FIG. 5 is yet another schematic view showing the integrated circuit chip according to the present invention.

The sealing base layer 34 is disposed within the sealing region 312 of the substrate 31. In this embodiment, a bottom surface of the substrate 31 is exposed from the sealing base layer 34, and the sealing base layer 34 has a plurality of sealing parts 341. The sealing parts 341 and the bottom surface of the substrate 31 are disposed vertically. Referring to FIG. 4, the sealing base layer 34 may also have only one sealing part 342, and a distance smaller than 0.2 mm exists between the sealing base layer 34 and the bottom surface of the substrate 31. Alternatively, the sealing base layer 34 has a plurality of sealing parts 343, and the sealing parts 343 are disposed alternately on the bottom surface of the substrate 31, as shown in FIG. 5.

The sealing ring stack layer 35 is disposed over and connected with the sealing base layer 34. In this embodiment, the sealing ring stack layer 35 includes a plurality of sealing metal layers 351, a plurality of sealing dielectric layers 352 and a plurality of sealing connection parts 353. The sealing metal layers 351 are disposed over the sealing base layer 34. The sealing dielectric layers 352 are respectively disposed between the sealing metal layers 351. The sealing connection parts 353 are disposed within the sealing dielectric layers 352 to respectively connect with the sealing metal layers 351.

The integrated circuit chip 3 may further include a protecting layer 36 disposed on the interconnection layer 33 and the sealing ring stack layer 35 to protect the internal traces of the interconnection layer 33.

The integrated circuit chip 3 may further include a plurality of chip pads 37, which is disposed on an active surface 38 of the integrated circuit chip 3 and connected with at least one of the metal layers 331. The chip pad 37 of the integrated circuit chip 3 may be used as a test terminal, a signal terminal, a power terminal or a ground terminal.

Figure 6:
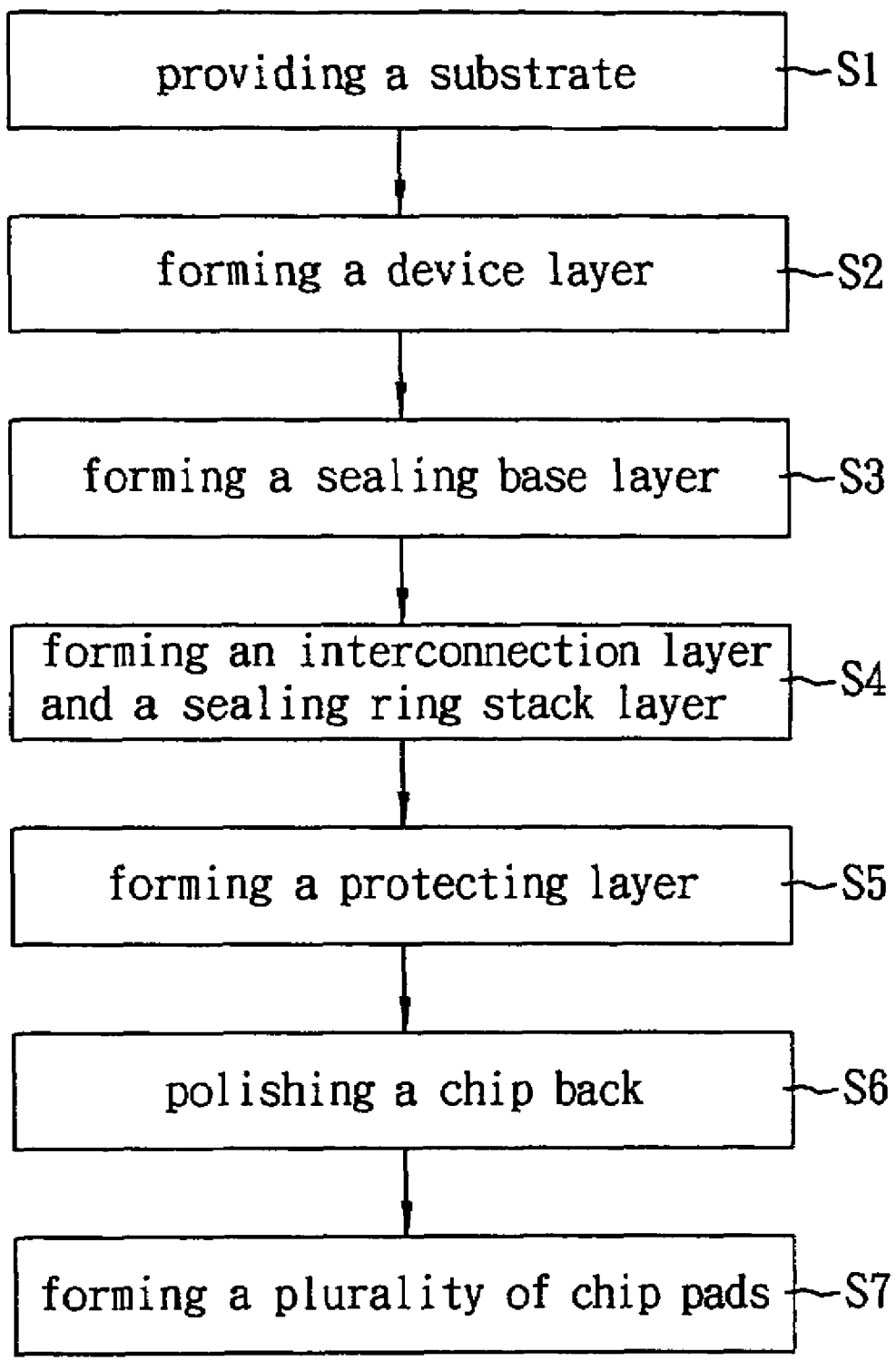
FIG. 6 is, a flow chart showing a manufacturing process of the integrated circuit chip according to the present invention.

Referring to FIG. 6, a manufacturing process of the integrated circuit chip 3 according to the present invention includes the following steps. First, the step Si is to provide a substrate 31 having a chip region 311 and a sealing region 312 disposed around the chip region 311.

Next, the step S2 is to form a device layer 32 within the chip region 311 of the substrate 31. The device layer 32 has a plurality of transistors each having the electrodes of source, drain and gate.

Then, the step S3 is to form a sealing base layer 34 within the sealing region 312 of the substrate 31 by the sub-steps of: forming at least one hole 313 (in FIG. 3) on the substrate 31 by drilling or etching; filling a metal material 314 (in FIG. 3), which may be aluminum, silver, copper or their alloy, into the hole 313. In addition, the sealing base layer 34 may have a plurality of sealing parts 341 (in FIG. 3) in the step S3, wherein the sealing parts 341 are disposed vertically on the bottom surface of the substrate 31. Alternatively, the sealing base layer 34 may have only one sealing part 342 (FIG. 4), or a plurality of sealing parts 343, wherein the sealing parts 343 are disposed alternately on the bottom surface of the substrate 31, as shown in FIG. 5.

Next, the step S4 is to form an interconnection layer 33 and a sealing ring stack layer 35 respectively over the device layer 32 and the sealing base layer 34. The step of forming the interconnection layer 33 may include the sub-steps of: forming a plurality of metal layers 331 over the device layer 32; forming a plurality of dielectric layers 332 respectively between the metal layers 331; and forming a plurality of interconnections 333 respectively within the dielectric layers 332 to electrically connect with the metal layers 331. The step of forming the sealing ring stack layer 35 includes the sub-steps of: forming a plurality of sealing metal layers 351 over the sealing base layer 34; forming a plurality of sealing dielectric layers 352 respectively between the sealing metal layers 351; and forming a plurality of sealing connection parts 353 respectively within the sealing dielectric layers 352 to connect with the sealing metal layers 351.

In this embodiment, the interconnection layer 33 and the sealing ring stack layer 35 are formed in the same one step. Of course, the interconnection layer 33 and the sealing ring stack layer 35 may be formed in two steps in the manufacturing process of the integrated circuit chip 3, and the order of forming the interconnection layer 33 and the sealing ring stack layer 35 is not particularly restricted.

The manufacturing process of the integrated circuit chip 3 according to the present invention may further include a step S5 of forming a protecting layer 36 on the interconnection layer 33 and the sealing ring stack layer 35 so as to protect the internal traces of the interconnection layer 33.

The manufacturing process may include a step S6 of polishing a chip back such that the bottom surface of the substrate 31 is exposed from the sealing base layer 34, or such that the distance from the sealing base layer 34 to the bottom surface of the substrate 31 is smaller than 0.2 mm. In this embodiment, the bottom surface of the substrate 31 may be polished by chemical mechanical polishing (CMP).

Finally, the manufacturing process of the integrated circuit chip 3 according to the present invention may further include a step S7 of forming a plurality of chip pads 37 on an active surface 38 of the integrated circuit chip 3 and connecting the chip pads 37 with at least one of the metal layer 331.

The present invention does not intend to restrict the order of the steps of the manufacturing process of the integrated circuit chip 3, and the order may be changed according to the practical condition.

Figure 7:
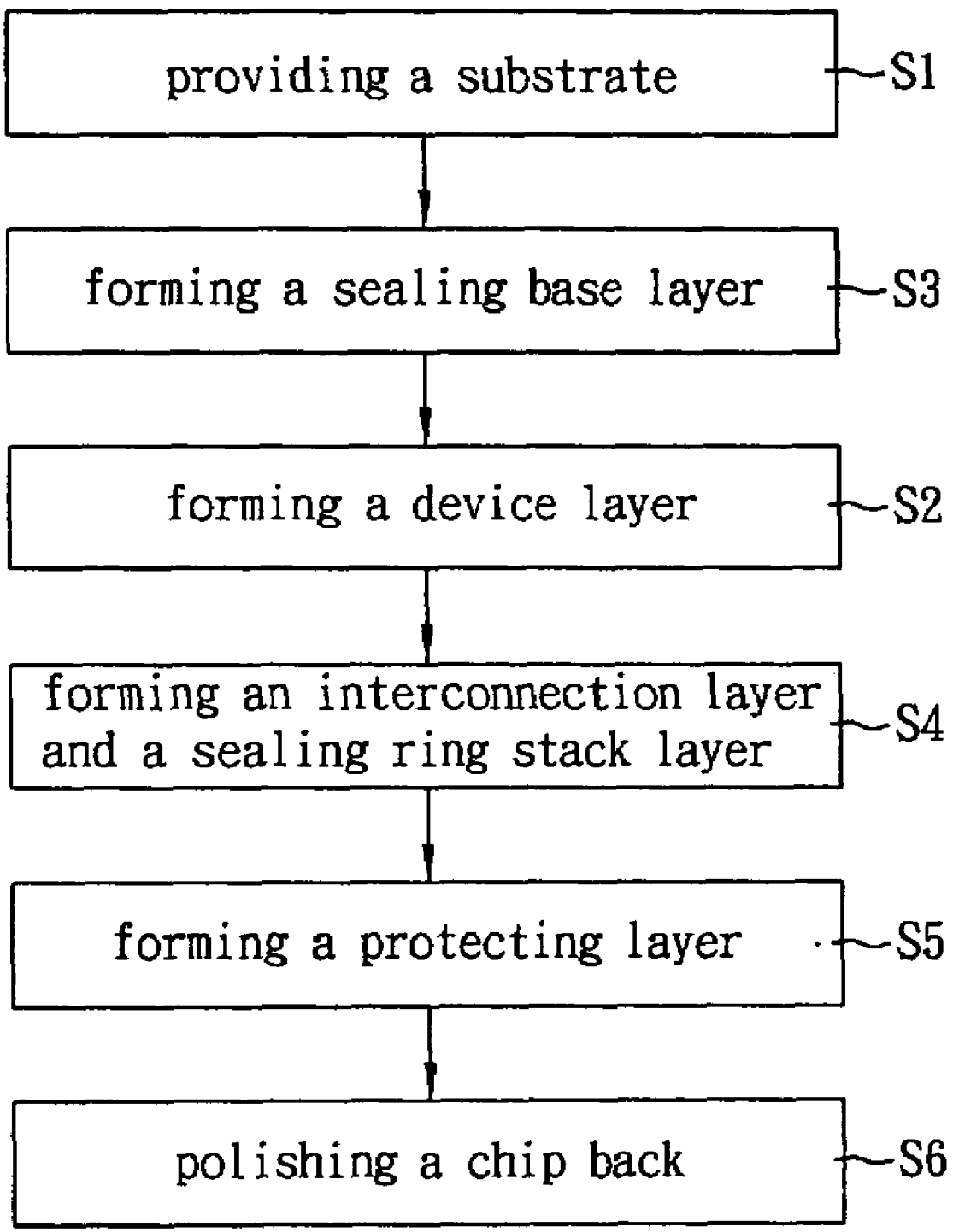
FIG. 7 is another flow chart showing the manufacturing process of the integrated circuit chip according to the present invention.
Figure 8:
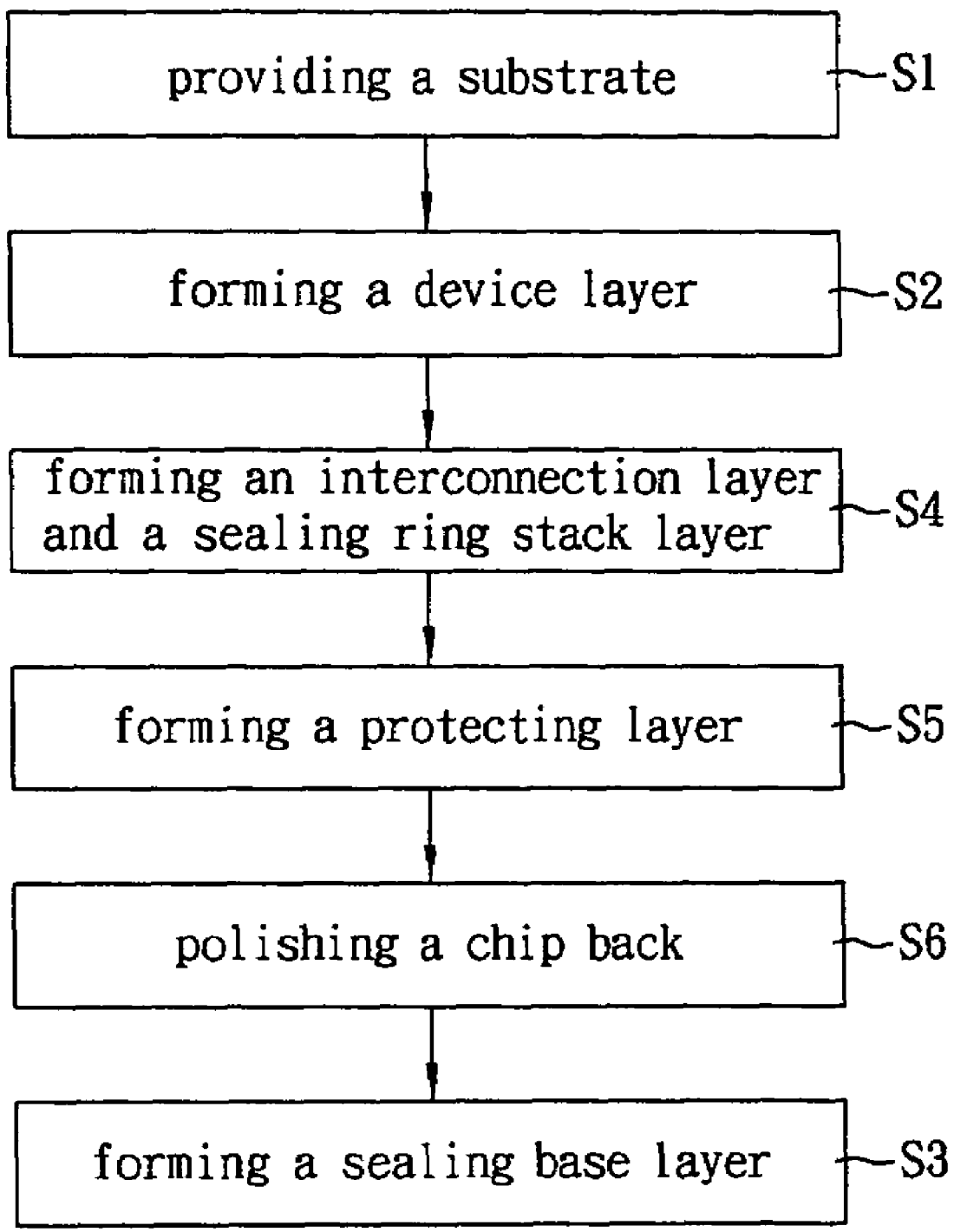
FIG. 8 is yet another flow chart showing the manufacturing process of the integrated circuit chip according to the present invention.

As shown in FIG. 7, the order for the steps S2 and S3 is changed by exchanging the step S2 with the step S3 of FIG. 6. Alternatively, as shown in FIG. 8, the step S3 is changed to follow the step S6. Even so, the manufacturing process of the integrated circuit chip 3 according to the present invention is free from being influenced, and the modifications should fall within the scope of the present invention.

In summary, the sealing base layer prevents the crack generated by the stress from entering an internal structure of the integrated circuit chip through the gap between the bottom surface of the substrate and the sealing ring stack layer and thus provides the complete protection to the integrated circuit chip. Compared with the prior art, the internal traces of an integrated circuit chip and a manufacturing process of the integrated circuit chip according to the present invention will not be damaged by the stress during the process of wafer slicing, packaging, testing or transporting or other manufacturing processes. Thus, the production quality and the manufacturing efficiency of the integrated circuit chip can be enhanced effectively.

Although the present invention has been described with reference to specific embodiments, this description is not meant to be construed in a pivoting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. An integrated circuit chip, comprising:
   a substrate having an inner region and a sealing region disposed around the inner region;
   a device layer disposed within the inner region;
   an interconnection layer disposed over and connected with the device layer;
   a sealing base layer disposed within the sealing region;
   at least one sealing part disposed under the sealing base layer within the sealing region and connected with the sealing base layer; and
   a sealing ring stack layer disposed over and connected with the sealing base layer.

2. The integrated circuit chip according to claim 1, further comprising:
   a protecting layer disposed on the interconnection layer and the sealing ring stack layer.

3. The integrated circuit chip according to claim 1, wherein the sealing part is exposed on a bottom surface of the substrate.

4. The integrated circuit chip according to claim 1, wherein a distance from the sealing part to a bottom surface of the substrate is smaller than 0.2 mm.

5. The integrated circuit chip according to claim 1, wherein the integrated circuit chip has a plurality of the sealing parts, and the sealing parts are disposed vertically to a bottom surface of the substrate.

6. The integrated circuit chip according to claim 1, wherein the integrated circuit chip has a plurality of the sealing parts, and the sealing parts are disposed alternately on the bottom surface of the substrate.

7. The integrated circuit chip according to claim 1, wherein the sealing ring stack layer comprises:
   a plurality of sealing metal layers disposed over the sealing base layer;
   a plurality of sealing dielectric layers respectively disposed between the sealing metal layers; and
   a plurality of sealing connection parts respectively disposed within the sealing dielectric layers to respectively connect with the sealing metal layers.

8. The integrated circuit chip according to claim 1, wherein the device layer has a plurality of transistors.

9. The integrated circuit chip according to claim 8, wherein the transistor has the electrodes of source, drain and gate.

10. The integrated circuit chip according to claim 1, wherein the interconnection layer comprises:
    a plurality of metal layers disposed over the device layer;
    a plurality of dielectric layers respectively disposed between the metal layers; and
    a plurality of interconnections respectively disposed within the dielectric layers to electrically connect with the metal layers.

11. The integrated circuit chip according to claim 10, wherein the interconnections are wires, conductive vias or contacts.

12. The integrated circuit chip according to claim 10, further comprising:
    a plurality of chip pads disposed on an active surface of the integrated circuit chip and electrically connected with at least one of the metal layers.

13. A manufacturing process of an integrated circuit chip, comprising the steps of:
    providing a substrate, which has an inner region and a sealing region disposed around the inner region;
    forming a device layer within the inner region;
    forming a sealing base layer within the sealing region and at least one sealing part disposed under the sealing base layer within the sealing region, wherein the sealing base layer is connected with the sealing base layer;
    forming an interconnection layer and a sealing ring stack layer,
    wherein the interconnection layer is over the device layer and connecting the interconnection layer with the device layer, and the sealing ring stack layer is over the sealing base layer and connecting the sealing ring stack layer with the sealing base layer; and
    forming a protecting layer on the interconnection layer and the sealing ring stack layer;
    wherein the step of forming the sealing ring stack layer comprises:
        forming a plurality of sealing metal layers aver the sealing base layer;
        forming a plurality of sealing dielectric layers respectively between the sealing metal layers; and
        forming a plurality of sealing connection parts respectively within the sealing dielectric layers and connecting the sealing connection parts with sealing metal layers;
    wherein the step of forming the interconnection layer comprises:
        forming a plurality of metal layers over the device layer;
        forming a plurality of dielectric layers respectively between the metal layers; and
        forming a plurality of interconnections respectively within the dielectric layers to electrically connect with the metal layers;
    wherein the step of forming the sealing base layer and the sealing part comprises:
        forming a sealing base hole and at least one sealing part hole on the substrate; and
        filling a metal material into the sealing base hole and the sealing part hole.

14. The manufacturing process according to claim 13, further comprising a step of:
   polishing a chip back such that the sealing part is exposed on a bottom surface of substrate.

15. The manufacturing process according to claim 13, further comprising a step of:
   polishing a chip back such that a distance from the sealing part to a bottom surface of the substrate is smaller than 0.2 mm.

16. The manufacturing process according to claim 13, wherein the integrated circuit chip has a plurality of the sealing parts, and the sealing parts are disposed vertically to a bottom surface of the substrate.

17. The manufacturing process according to claim 13, wherein the integrated circuit chip has a plurality of the sealing parts, and the sealing parts are disposed alternately on a bottom surface of the substrate.

18. The manufacturing process according to claim 13, further comprising a step of:
   forming a plurality of chip pads on an active surface of the integrated circuit chip and electrically connecting the chip pads with at least one of the metal layers.

19. The manufacturing process according to claim 13, wherein the sealing base hole and the sealing part hole are is formed by drilling or etching.

20. The manufacturing process according to claim 13, wherein the metal material is aluminum, silver, copper or their alloy.

* * * * *